(12) United States Patent
Lee et al.

(10) Patent No.: US 7,687,915 B2
(45) Date of Patent: Mar. 30, 2010

(54) SEMICONDUCTOR DEVICE HAVING CRACK STOP STRUCTURE

(75) Inventors: Kyoung-woo Lee, Suwon-si (KR); Hong-jae Shin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/216,097

(22) Filed: Jun. 30, 2008

(65) Prior Publication Data

US 2009/0096104 A1    Apr. 16, 2009

(30) Foreign Application Priority Data

Oct. 15, 2007    (KR) .................... 10-2007-0103709

(51) Int. Cl.
*H01L 23/522* (2006.01)
(52) U.S. Cl. .................. 257/758; 257/E23.161
(58) Field of Classification Search ............... 257/620, 257/758, E23.161
See application file for complete search history.

(56) References Cited

U.S. PATENT DOCUMENTS 6,022,791 A * 2/2000 Cook et al. ............... 438/458
7,163,883 B2 * 1/2007 Agarwala et al. ........... 438/598
2008/0093746 A1 * 4/2008 Lee et al. .................. 257/776

FOREIGN PATENT DOCUMENTS

| JP | 10-041408 | 2/1998 |
| JP | 2000-150429 | 5/2000 |
| JP | 2000-277465 | 10/2000 |

* cited by examiner

*Primary Examiner*—Roy K Potter
(74) *Attorney, Agent, or Firm*—Harness, Dickey & Pierce, P.L.C.

(57) ABSTRACT

Example embodiments relate to semiconductor devices having a single body crack stop structure configured to reduce or prevent crack propagation and/or moisture penetration. A semiconductor substrate according to example embodiments may include an active region and a crack stop region surrounding the active region. Interlayer insulating layers may be sequentially stacked on the semiconductor substrate. The interlayer insulating layers may include first dual damascene patterns and a first opening. The first dual damascene patterns may be formed in the interlayer insulating layers so as to be perpendicular to the surface of the semiconductor substrate while exposing a first portion of the semiconductor substrate. The first opening may be formed in the crack stop region and may extend through the interlayer insulating layers to expose a second portion of the semiconductor substrate. First dual damascene metal wirings may be formed in the first dual damascene patterns and may contact the exposed first portion of the semiconductor substrate. A single body first crack stop structure may be formed in the first opening so as to contact the exposed second portion of the semiconductor substrate.

20 Claims, 15 Drawing Sheets

SEMICONDUCTOR DEVICE HAVING CRACK STOP STRUCTURE

PRIORITY STATEMENT

This application claims the benefit under 35 U.S.C. §119 to Korean Patent Application No. 10-2007-0103709, filed on Oct. 15, 2007 in the Korean Intellectual Property Office (KIPO), the entire contents of which are incorporated herein by reference.

BACKGROUND

1. Technical Field

Example embodiments relate to a semiconductor device having a structure for reducing or preventing the propagation of cracks and/or moisture penetration.

2. Description of the Related Art

After a plurality of integrated circuits are formed on a semiconductor wafer, the semiconductor wafer is cut using a wafer cutting process so as to be divided into a plurality of semiconductor chips. The wafer cutting process uses a cutting blade to cut the wafer along a scribe wiring of the wafer. However, with a conventional semiconductor device structure, cracks occur in an interlayer insulating layer and propagate from the edge of the semiconductor chip toward an active region during the wafer cutting process, thereby damaging the semiconductor chip. Additionally, moisture penetrates through the cutting plane of the interlayer insulating layer, thereby causing further damage to the semiconductor chip.

SUMMARY

Example embodiments relate to semiconductor devices having a single body crack stop structure arranged to surround an active region so as to reduce or prevent crack propagation and/or moisture penetration.

A semiconductor device according to example embodiments may include a semiconductor substrate having a crack stop region surrounding an active region. A plurality of interlayer insulating layers may be disposed on the semiconductor substrate. First dual damascene patterns may be disposed in the plurality of interlayer insulating layers so as to be aligned perpendicularly to the semiconductor substrate. The first dual damascene patterns may also expose a first portion of the semiconductor substrate in the active region. A first opening may extend through the plurality interlayer insulating layers to expose a second portion of the semiconductor substrate in the crack stop region. First dual damascene metal wirings may be disposed in the first dual damascene patterns. At least one of the first dual damascene metal wirings may contact the exposed first portion of the semiconductor substrate. A single body first crack stop structure may be disposed in the first opening so as to contact the exposed second portion of the semiconductor substrate.

The plurality of interlayer insulating layers may include a lower-k insulating layer. The first crack stop structure may be formed of the same material as the first dual damascene metal wirings. For instance, the first crack stop structure and the first dual damascene metal wirings may include copper (Cu). A first insulating layer may also be disposed between the plurality of interlayer insulating layers and the semiconductor substrate. The first insulating layer may include a first metal contact on the exposed first portion of the semiconductor substrate. A first metal contact plug may be disposed in the first metal contact, wherein the first metal contact plug may contact at least one of the first dual damascene metal wirings.

The first opening may extend through the first insulating layer and the plurality of interlayer insulating layers to allow the first crack stop structure to directly contact the exposed second portion of the semiconductor substrate. The first insulating layer may further include a second metal contact on the exposed second portion of the semiconductor substrate. A second metal contact plug may be disposed in the second metal contact. The first crack stop structure may contact the exposed second portion of the semiconductor substrate through the second metal contact plug.

BRIEF DESCRIPTION OF THE DRAWINGS

The above and other features of example embodiments may become more apparent upon review of the detailed description with reference to the attached drawings in which.

DETAILED DESCRIPTION OF EXAMPLE EMBODIMENTS

Figure 1A:
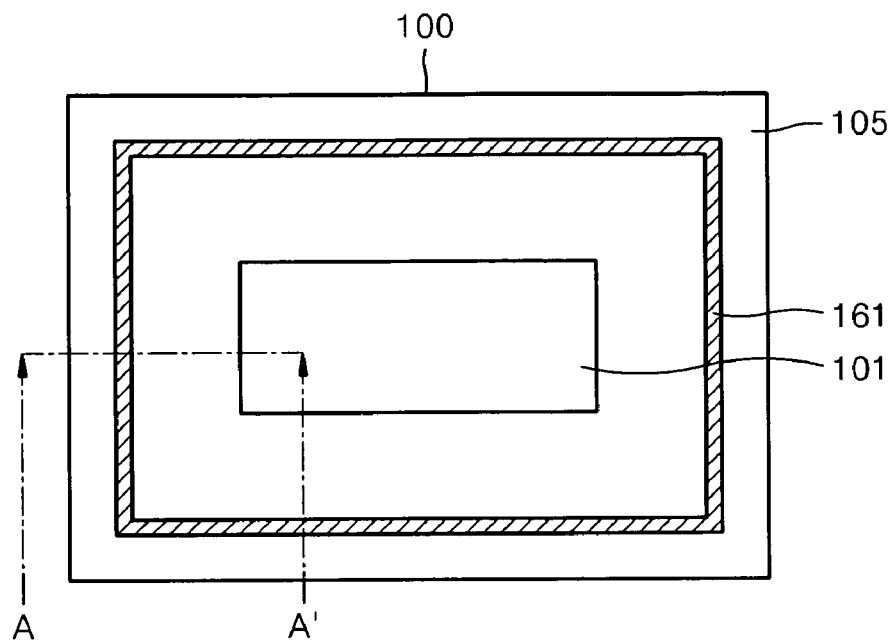
FIG. 1A is a plan view of a semiconductor device having a single body crack stop structure according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Example embodiments are described in further detail below with reference to the accompanying drawings. Example embodiments may, however, be embodied in many different forms and should not be construed as being limited to the examples set forth herein. In the drawings, the thicknesses of layers and regions may have been exaggerated for clarity. For purposes of brevity, the description of like elements may be provided in initial examples but omitted in subsequent examples.

Figure 1B:
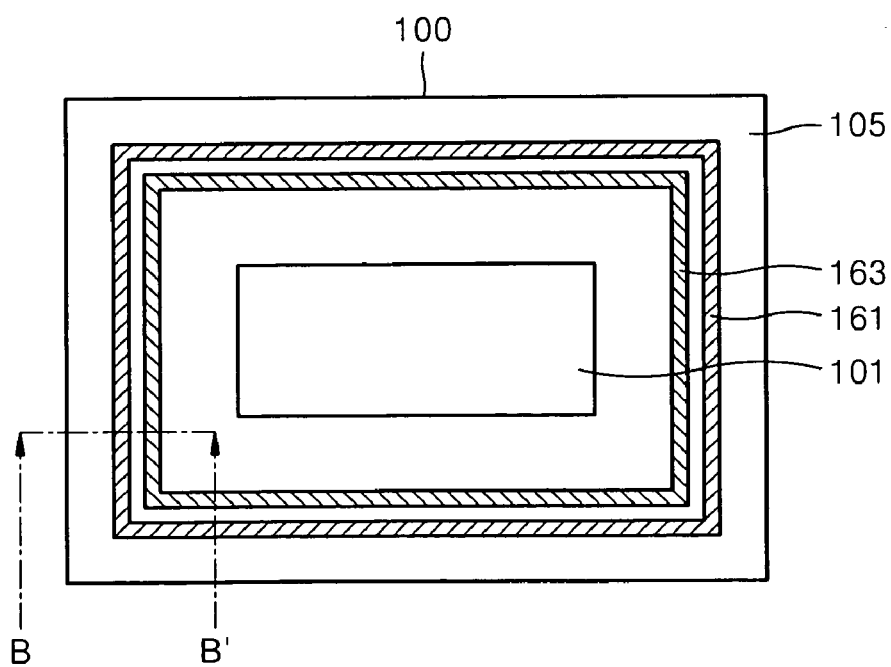
FIG. 1B is a plan view of another semiconductor device having a single body crack stop structure according to example embodiments.
Figure 1C:
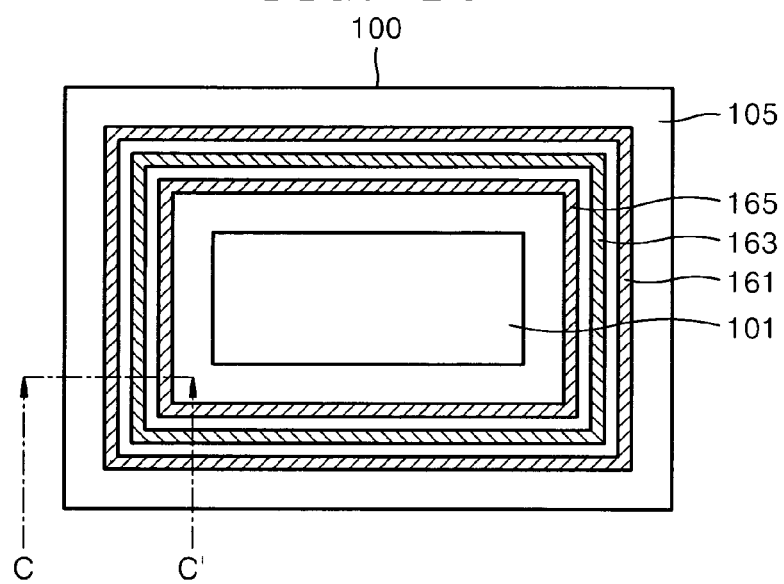
FIG. 1C is a plan view of another semiconductor device having a single body crack stop structure according to example embodiments.

FIGS. 1A through 1C are plan views of semiconductor devices having single body type crack stop structures according to example embodiments. Referring to FIGS. 1A through 1C, each of the semiconductor devices may include a semiconductor substrate 100 having an active region 101 and a crack stop region 105 surrounding the active region 101. A semiconductor chip (not shown) may be formed in the active region 101. At least one of a first crack stop structure 161, a second crack stop structure 163, and a third crack stop structure 165 may be formed in the crack stop region 105 to reduce or prevent the propagation of cracks and/or penetration of moisture into the semiconductor chip. The first crack stop structure 161 may be disposed on an outer portion of the crack stop region 105. At least one of the second crack stop structure 163 and the third crack stop structure 165 may be disposed between the first crack stop structure 161 and the active region 101. The first crack stop structure 161, the second crack stop structure 163, and/or third crack stop structure 165 may have a single body structure or a split structure.

Figure 2:
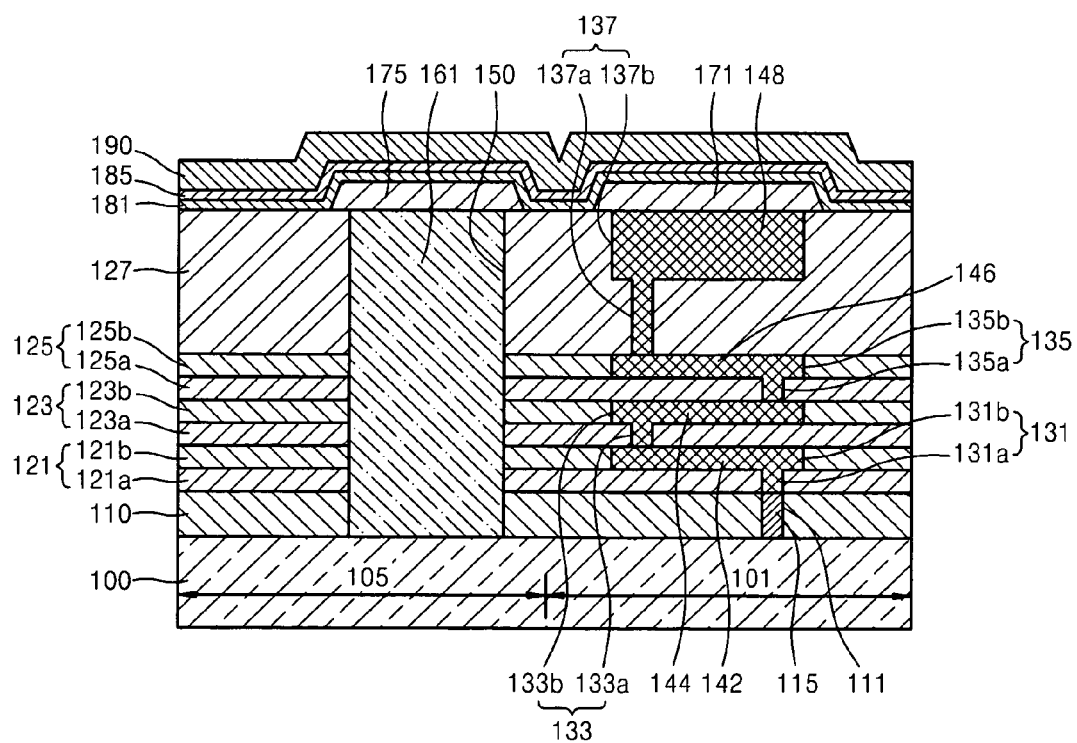
FIG. 2 is a cross-sectional view of a semiconductor device according to FIG. 1A, taken along line A-A'.

FIG. 2 is a cross-sectional view of a semiconductor device according to FIG. 1A, taken along line A-A'. Referring to FIG. 2, an insulating layer 110 may be formed on the semiconductor substrate 100. The insulating layer 110 may include at least one of a gate insulating layer and an interlayer insulating layer. A transistor, a capacitor, and wiring may be arranged in the active region 101. A first metal contact 111 may be formed in the insulating layer 110 to expose a portion of the semiconductor substrate 100 in the active region 101. A first metal contact plug 115 may be formed in the first metal contact 111. The first metal contact plug 115 may include tungsten (W). Additionally, the first metal contact plug 115 may include a barrier metal layer and a metal layer. The barrier metal may include Ta/TaN.

First to fourth interlayer insulating layers 121, 123, 125, and 127 may be sequentially formed on the insulating layer 110. Each of the first to fourth interlayer insulating layers 121, 123, 125, and 127 may include a doped oxide layer. For example, a doped oxide layer may be a carbon-doped oxide layer, a fluorine-doped oxide (FSG) layer, a hydrogen silsesquiozane (HSQ) layer, a methyl silsesquiozane (MSQ) layer, or a-SiOC (SiOC:H) layer. Each of the first to fourth interlayer insulating layers 121, 123, 125, and 127 may be formed by plasma enhanced chemical vapor deposition (PECVD), higher density plasma CVD (HDP-CVD), atmospheric pressure CVD (APCVD), or spin coating.

The first interlayer insulating layer 121 may include a first upper interlayer insulating layer 121$b$ on a first lower interlayer insulating layer 121$a$. The second interlayer insulating layer 123 may include a second upper interlayer insulating layer 123$b$ on a second lower interlayer insulating layer 123$a$. The third interlayer insulating layer 125 may include a third upper interlayer insulating layer 125$b$ on a third lower interlayer insulating layer 125$a$.

The first interlayer insulating layer 121 may include a first dual damascene pattern 131 having a first via 131$a$ formed in the first lower interlayer insulating layer 121$a$ and a first trench 131$b$ formed in the first upper interlayer insulating layer 121$b$. The second interlayer insulating layer 123 may include a second dual damascene pattern 133 having a second via 133$a$ formed in the second lower interlayer insulating layer 123$a$ and a second trench 133$b$ formed in the second upper interlayer insulating layer 123$b$. The third interlayer insulating layer 125 may include a third dual damascene pattern 135 having a third via 135$a$ formed in the third lower interlayer insulating layer 125$a$ and a third trench 135$b$ formed in the third upper interlayer insulating layer 125$b$. The fourth interlayer insulating layer 127 may include a fourth dual damascene pattern 137 having a fourth via 137a and a fourth trench 137b.

A first dual damascene metal wiring 142 may be formed in the first dual damascene pattern 131 of the first interlayer insulating layer 121. A second dual damascene metal wiring 144 may be formed in the second dual damascene pattern 133 of the second interlayer insulating layer 123. A third dual damascene metal wiring 146 may be formed in the third dual damascene pattern 135 of the third interlayer insulating layer 125. A fourth dual damascene metal wiring 148 may be formed in the fourth dual damascene pattern 137 of the fourth interlayer insulating layer 127. Each of the first to fourth dual damascene metal wirings 142, 144, 146, and 148 may include at least one of copper (Cu) and a Ta/TaN barrier metal.

The first via 131a formed in the first lower interlayer insulating layer 121a may expose the first metal contact plug 115 to allow the first dual damascene metal wiring 142 to electrically contact the semiconductor substrate 100 through the first metal contact plug 115. The second via 133a formed in the second lower interlayer insulating layer 123a may expose a portion of the first dual damascene metal wiring 142 to allow an electrical connection with the second dual damascene metal wiring 144. The third via 135a formed in the third lower interlayer insulating layer 125a may expose a portion of the second dual damascene metal wiring 142 to allow an electrical connection with the third dual damascene metal wiring 146. The fourth via 137a formed in the fourth interlayer insulating layer 127 may expose a portion of the third dual damascene metal wiring 146 to allow an electrical connection with the fourth dual damascene metal wiring 148. The first to fourth vias 131a, 133a, 135a, and 137a may be disposed in a zigzag formation in a direction perpendicular to the surface of the semiconductor substrate 100, although example embodiments are not limited thereto. Alternatively, the first to fourth vias 131a, 133a, 135a, and 137a may be aligned in a linear fashion.

An opening 150 may be formed in the first to fourth interlayer insulating layers 121, 123, 125, and 127 to expose a portion of the semiconductor substrate 100 in crack stop region 105. A first crack stop structure 161 of a single body type may be formed in the opening 150. The first crack stop structure 161 may include the same material as the first to fourth dual damascene metal wirings 142, 144, 146, and 148. For example, the first crack stop structure 161 may include copper (Cu) and/or a Ta/TaN barrier metal. If crack stop structures are separately formed in the first to fourth interlayer insulating layers 121, 123, 125, and 127, cracks may still propagate through interfaces between the crack stop structures. Similarly, moisture may still penetrate through interfaces between the separately formed crack stop structures. However, the crack stop structure according to example embodiments may be formed as a single body penetrating the first to fourth interlayer insulating layers 121, 123, 125, and 127 so as to avoid interfaces that may otherwise be present in separately formed crack stop structures. Therefore, crack propagations and/or moisture penetration may be reduced or prevented.

A first metal pattern 171 may be formed on the fourth dual damascene metal wiring 148, and a second metal pattern 175 may be formed on the first crack stop structure 161. An inorganic passivation layer may be formed on the first and second metal patterns 171 and 175 and the fourth interlayer insulating layer 127. The inorganic passivation layer may include an oxide layer 181 and a nitride layer 185. An organic passivation layer 190 may be formed on the inorganic passivation layer. The first and second metal patterns 171 and 175 may enhance the adhesion between the inorganic passivation layer and the fourth dual damascene metal wiring 148 and the first crack stop structure 161. The first and second metal patterns 171 and 175 may include aluminum (Al). The oxide layer 181 and the nitride layer 185 may be alternately arranged where a plurality of such layers are utilized. The organic passivation layer 190 may include photo sensitive polyimide (PSPI).

Although not illustrated in the drawings, etch stop layers may be formed between the insulating layer 110 and the first interlayer insulating layer 121, between the first interlayer insulating layer 121 and the second interlayer insulating layer 123, between the second interlayer insulating layer 123 and the third interlayer insulating layer 125, and between the third interlayer insulating layer 125 and the fourth interlayer insulating layer 127. The etch stop layer may include a nitride insulating layer (e.g., SiN, SiON, BN) or a carbon insulating layer (e.g., SiC). The etch stop layer may serve as an etching stopper during dual damascene pattern formation and may reduce or prevent the spread of copper (Cu) from the first through fourth dual damascene metal wirings 142, 144, 146, and 148.

Figure 3A:
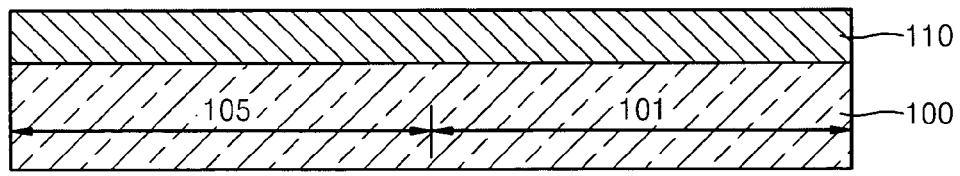
FIGS. 3A through 3L are cross-sectional views of a method of manufacturing the semiconductor device of FIG. 2.

FIGS. 3A through 3L are cross-sectional views of a method of forming the semiconductor device of FIG. 2. Referring to FIG. 3A, a semiconductor substrate 100 may include an active region 101 and a crack stop region 105. A semiconductor chip (not shown) may be formed in the active region 101, and a crack stop structure surrounding the active region 101 may be formed in the crack stop region 105. An insulating layer 110 may be formed on the semiconductor substrate 100.

Figure 3B:
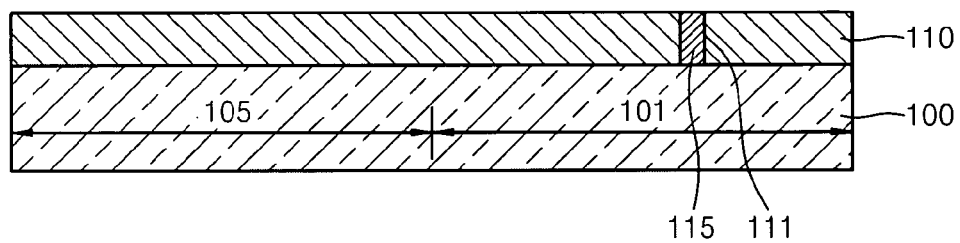

Referring to FIG. 3B, the insulating layer 110 may be etched to form a first metal contact 111 so as to expose a portion of the semiconductor substrate 100 in the active region 101. A metal layer (not shown) may be deposited on the insulating layer 110 to fill the first metal contact 111. The metal layer may be a copper (Cu) layer. The metal layer may be etched using an etch back process to form a first metal contact plug 115 in the first metal contact 111. Alternatively, after depositing a Ta/TaN barrier metal and metal layer (not shown) to fill the first metal contact 111, the metal layer and barrier metal may be etched using an etch back process to form the first metal contact plug 115.

Figure 3C:
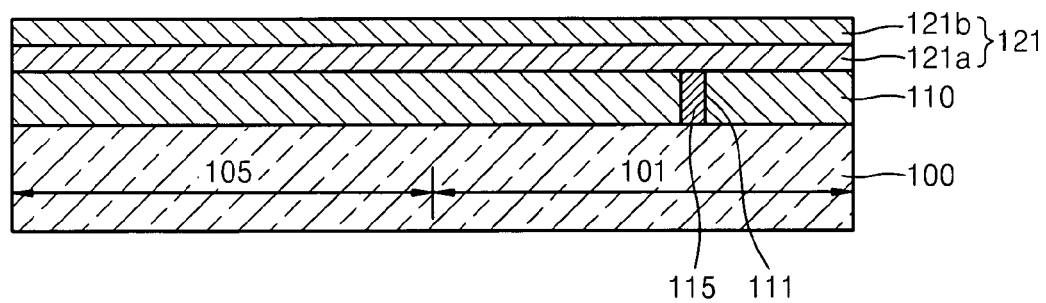

Referring to FIG. 3C, a first lower interlayer insulating layer 121a and a first upper interlayer insulating layer 121b may be formed on the insulating layer 110 to form a first interlayer insulating layer 121. The first interlayer insulating layer 121 may include a lower-k insulating layer.

Figure 3D:
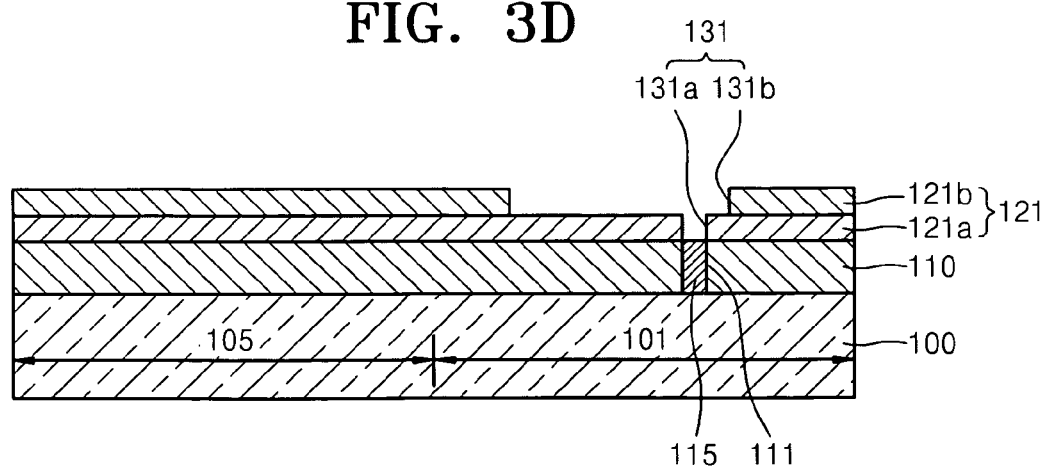

Referring to FIG. 3D, by using a dual damascene process, a first via 131a may be formed in the first lower interlayer insulating layer 121a to expose the first metal contact plug 115. A first trench 131b may be formed in the first upper interlayer insulating layer 121b to expose a portion of the first lower interlayer insulating layer 121a adjacent to the first via 131a. Accordingly, a first dual damascene pattern 131 including the first via 131a and the first trench 131b may be formed in the first interlayer insulating layer 121. In the first dual damascene pattern 131, the first trench 131b may be formed after forming the first via 131a or vice versa.

Figure 3E:
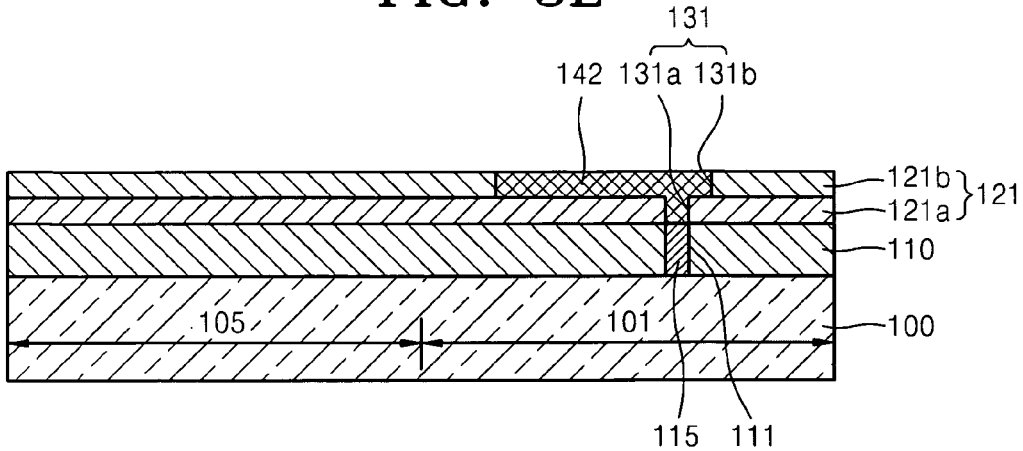

Referring to FIG. 3E, a metal layer (not shown) may be formed in the first interlayer insulating layer 121 to fill the first dual damascene pattern 131. The metal layer may be a copper (Cu) layer. The metal layer may be etched using a CMP process until the first interlayer insulating layer 121 is exposed, thus forming a first dual damascene metal wiring 142 in the first dual damascene pattern 131. Alternatively, a Ta/TaN barrier metal and a metal layer may be deposited to fill the first dual damascene pattern 131, and a CMP process may be performed to form the first dual damascene metal wiring 142 in the first dual damascene pattern 131.

Figure 3F:
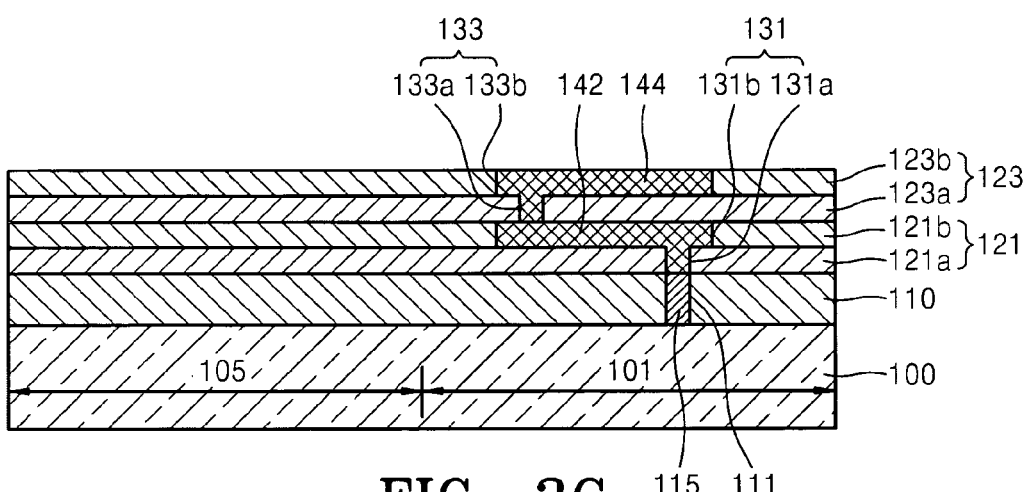

Referring to FIG. 3F, a second interlayer insulating layer 123 may be formed on the first dual damascene metal wiring 142 and the first interlayer insulating layer 121. The second interlayer insulating layer 123 may include a second lower interlayer insulating layer 123a and a second upper interlayer insulating layer 123b. By using a dual damascene process, a second via 133a may be formed in the second lower interlayer insulating layer 123a, and a second trench 133b may be formed in the second upper interlayer insulating layer 123b to form a second dual damascene pattern 133. A second dual damascene metal wiring 144 may be formed in the second dual damascene pattern 133.

Figure 3G:
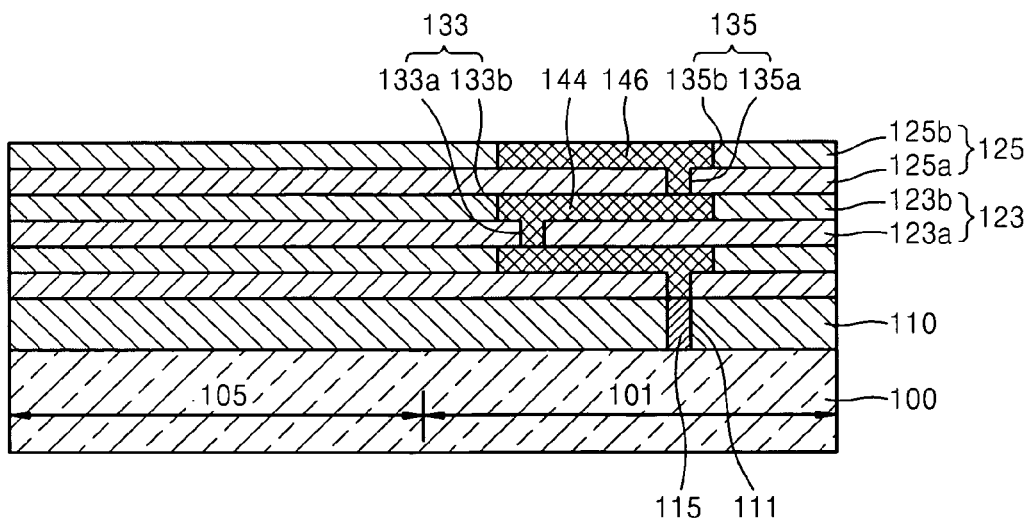

Referring to FIG. 3G, a third interlayer insulating layer 125 may be formed on the second dual damascene metal wiring 144 and the second interlayer insulating layer 123. The third interlayer insulating layer 125 may include a third lower interlayer insulating layer 125a and a third upper interlayer insulating layer 125b. By using a dual damascene process, a third via 135a may be formed in the third lower interlayer insulating layer 125a, and a third trench 135b may be formed in the third upper interlayer insulating layer 125b to form a third dual damascene pattern 135. A third dual damascene metal wiring 146 may be formed in the third dual damascene pattern 135.

Figure 3H:
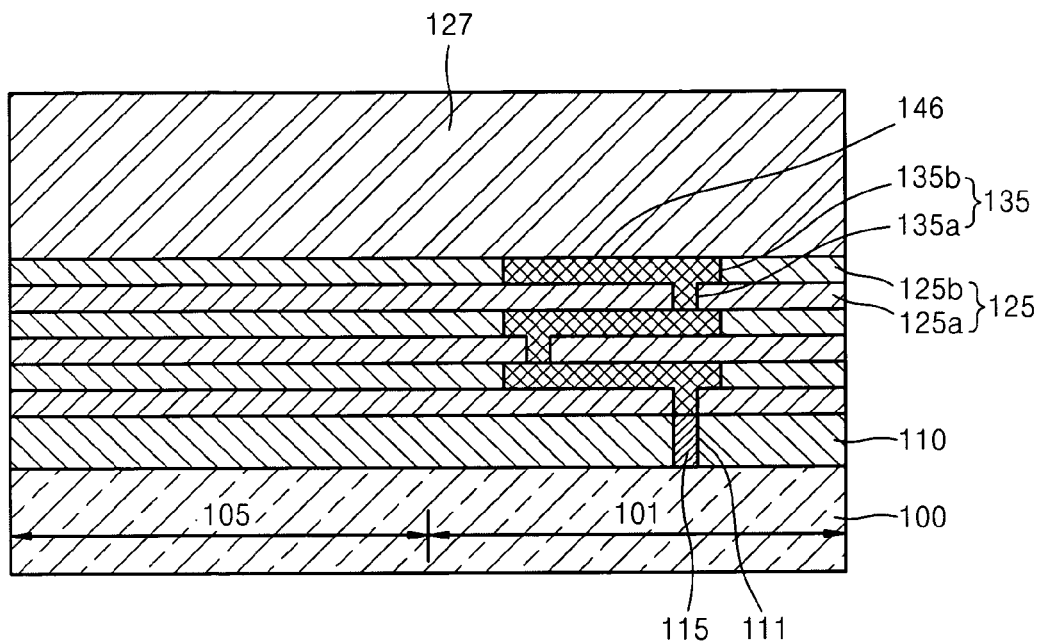
Figure 3I:
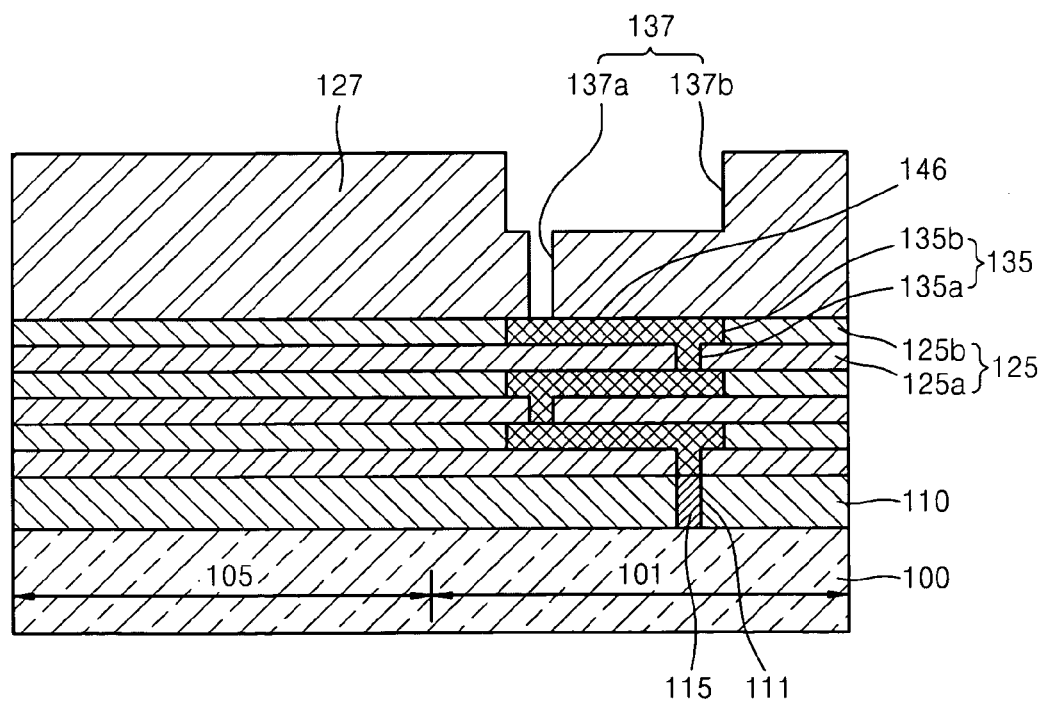
Figure 3J:
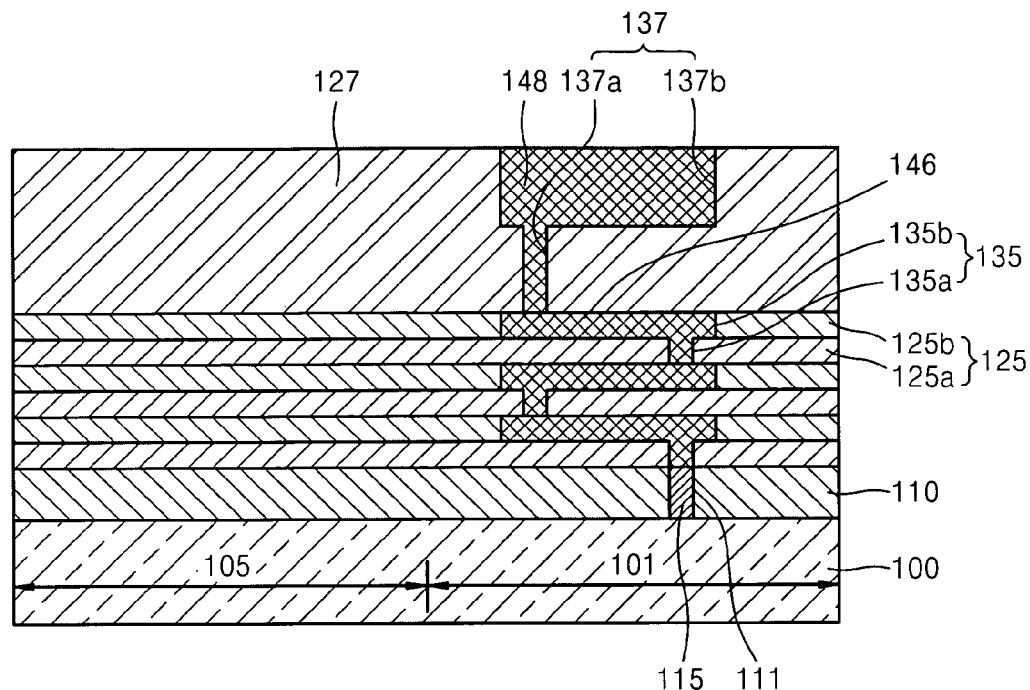

Referring to FIG. 3H, a fourth interlayer insulating layer 127 may be formed on the third dual damascene metal wiring 146 and the third interlayer insulating layer 125. Referring to FIG. 3I, by using a dual damascene process, a fourth dual damascene pattern 137 having a fourth via 137a and a fourth trench 137b may be formed in the fourth interlayer insulating layer 127. Referring to FIG. 3J, a fourth dual damascene metal wiring 148 may be formed in the fourth dual damascene pattern 137.

Figure 3K:
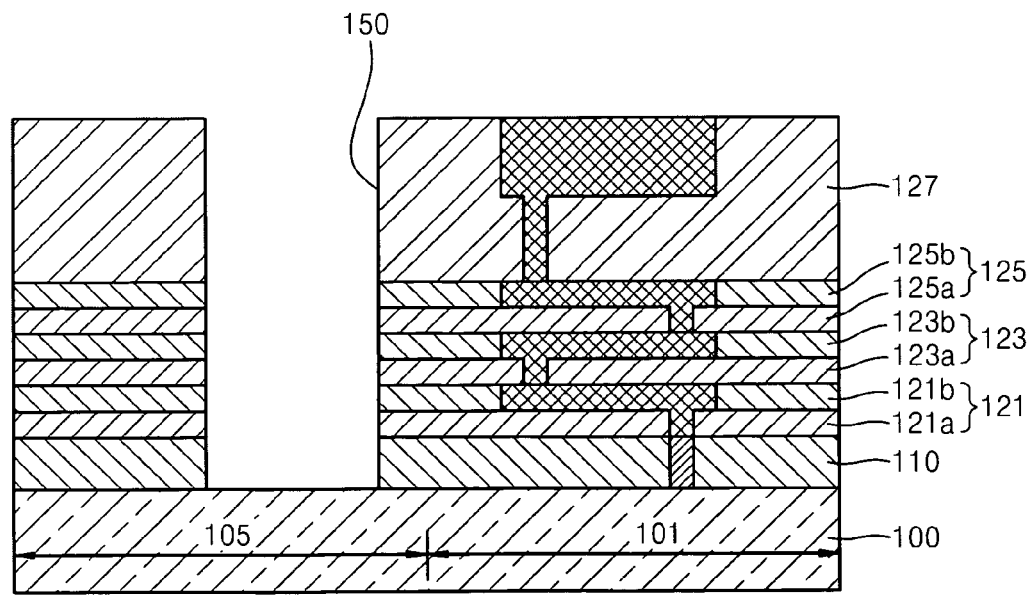
Figure 3L:
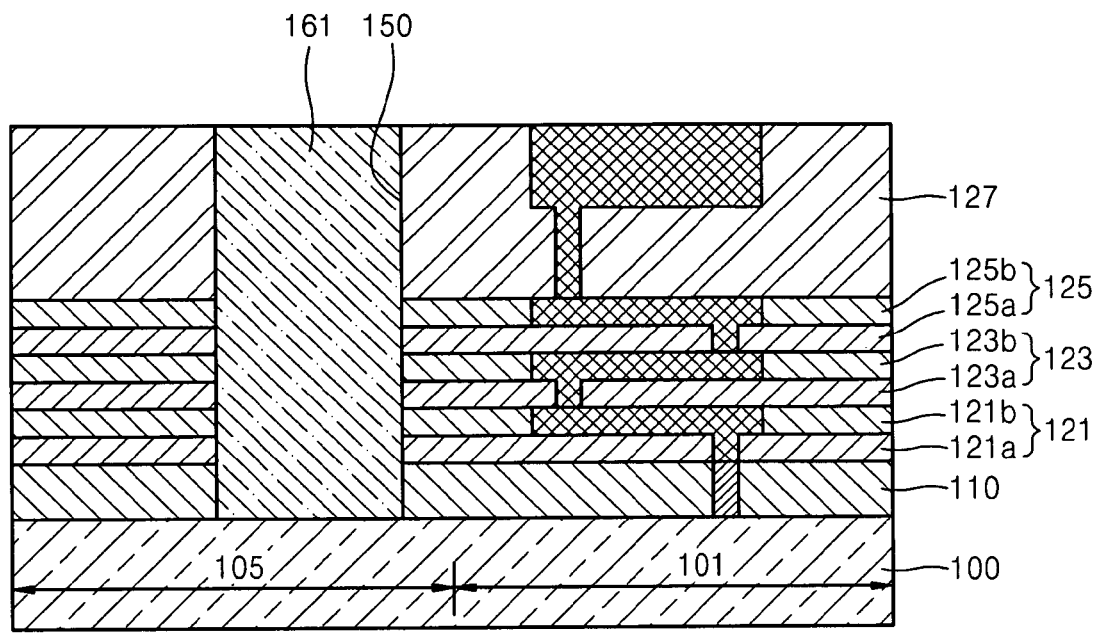

Referring to FIG. 3K, the insulating layer 110 and the first to fourth interlayer insulating layers 121, 123, 125, and 127 may be etched to form an opening 150 that exposes a portion of the crack stop region 105 of the semiconductor substrate 100. A metal layer (not shown) may be deposited on the fourth interlayer insulating layer 127 to fill the opening 150. Referring to FIG. 3L, a CMP process may be used to form a single body type first crack stop structure 161 in the opening 150. The first crack stop structure 161 may contact the portion of the semiconductor substrate 100 exposed by the opening 150. The first crack stop structure 161 may include a barrier metal and a metal layer. While forming the opening 150 through an etching process, a portion of the semiconductor substrate 100 may also be etched.

As illustrated in FIG. 2, a first metal pattern 171 and a second metal pattern 175 may be formed on the fourth dual damascene metal wiring 148 and the first crack stop structure 161, respectively. Additionally, an inorganic passivation layer including an oxide layer 181 and a nitride layer 185 may be formed on the first and second metal patterns 171 and 175. Furthermore, an organic passivation layer 190 may be formed on the inorganic passivation layer.

Figure 4:
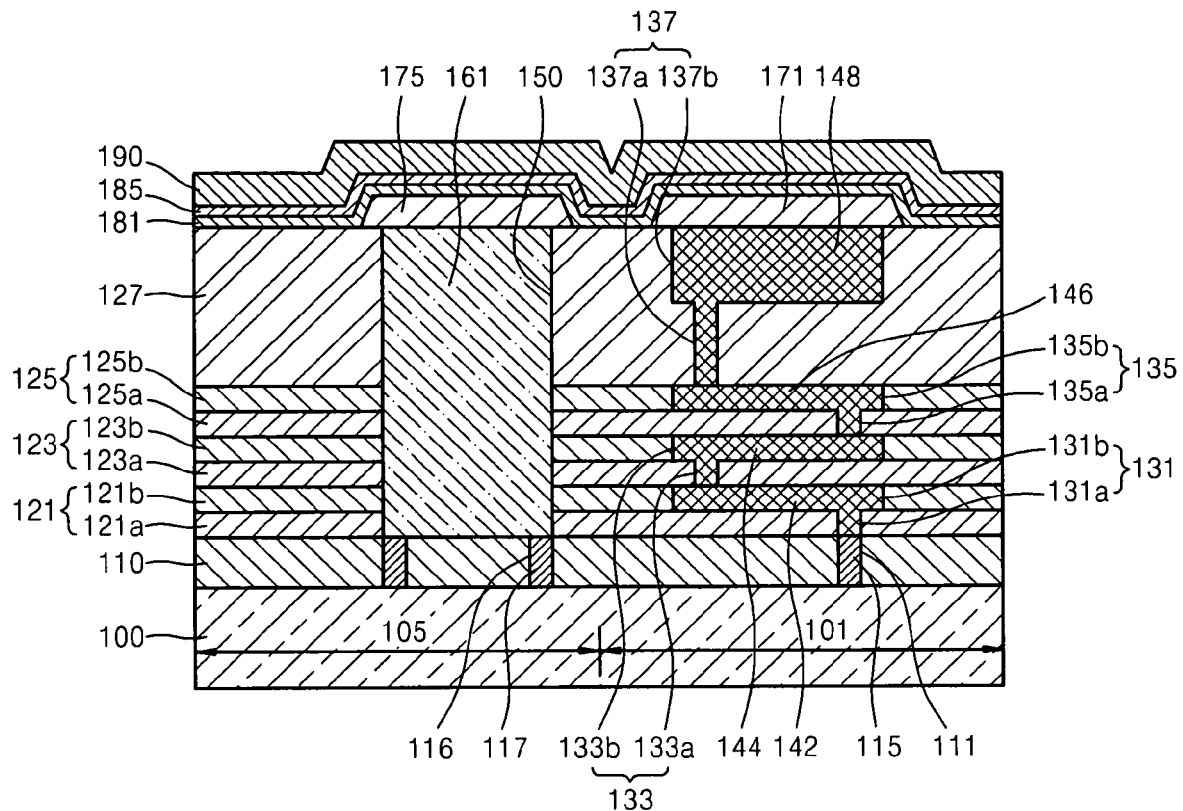
FIG. 4 is a cross-sectional view of another semiconductor device according to FIG. 1A, taken along line A-A'.

FIG. 4 is a cross-sectional view of another semiconductor device according to FIG. 1A, taken along the line A-A'. The semiconductor device of FIG. 4 may resemble that of FIG. 2, except for the differences described below. As noted above, the description of previously-discussed elements may have been omitted below for purposes of brevity. Referring to FIG. 4, a second metal contact 116 may be formed in the insulating layer 110 in the crack stop region 105, and a second metal contact plug 117 may be formed in the second metal contact 116. An opening 150 may be formed in the first to fourth interlayer insulating layers 121, 123, 125, and 127. A first crack stop structure 161 may be formed in the opening 150. The first crack stop structure 161 may contact the second metal contact plug 117.

Figure 5A:
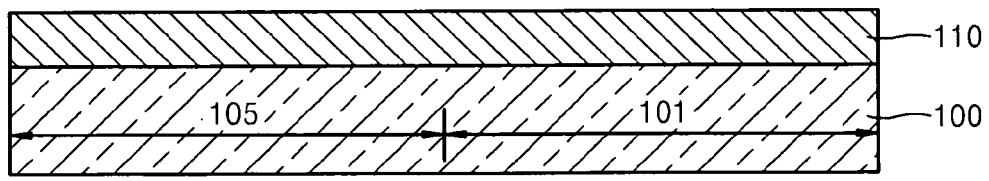
FIGS. 5A through 5G are cross-sectional views of a method of manufacturing the semiconductor device of FIG. 4.
Figure 5B:
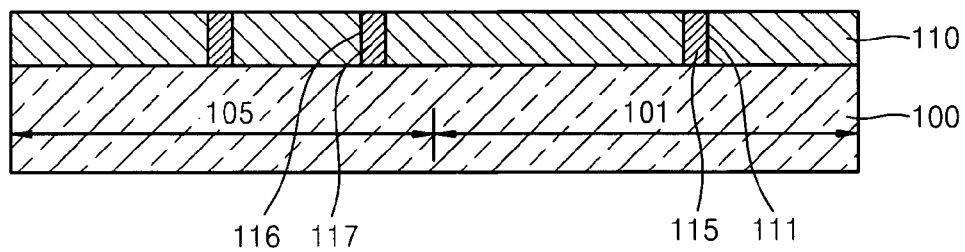

FIGS. 5A through 5G are cross-sectional views of a method of forming the semiconductor device of FIG. 4. Referring to FIG. 5A, an insulating layer 110 may be formed on a semiconductor substrate 100 having an active region 101 and a crack stop region 105. Referring to FIG. 5B, by etching the insulating layer 110, a first metal contact 111 may be formed to expose a portion of the semiconductor substrate 100 in the active region 101. A second metal contact 116 may also be formed in the insulating layer 110 to expose a portion of the semiconductor substrate 100 in the crack stop region 105. A first metal contact plug 115 may be formed in the first metal contact 111, and a second metal contact plug 117 may be formed in the second metal contact 116.

Figure 5C:
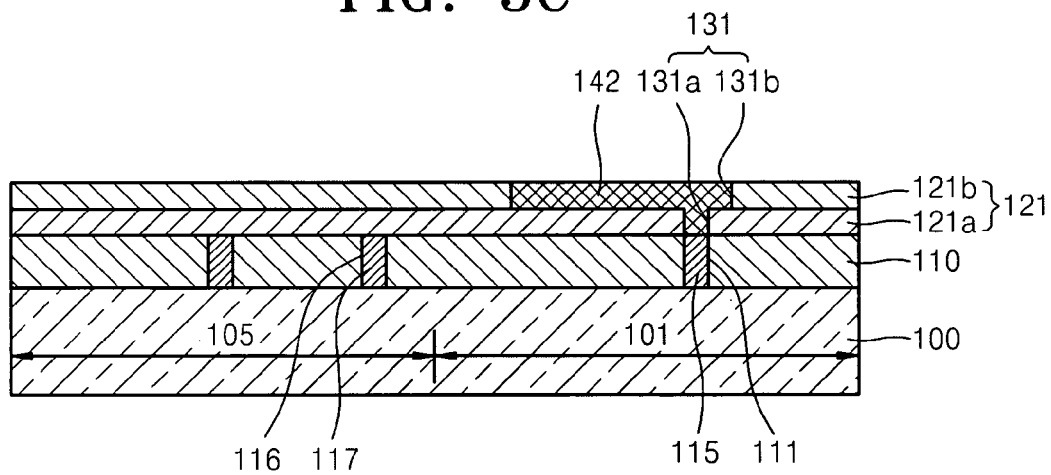
Figure 5D:
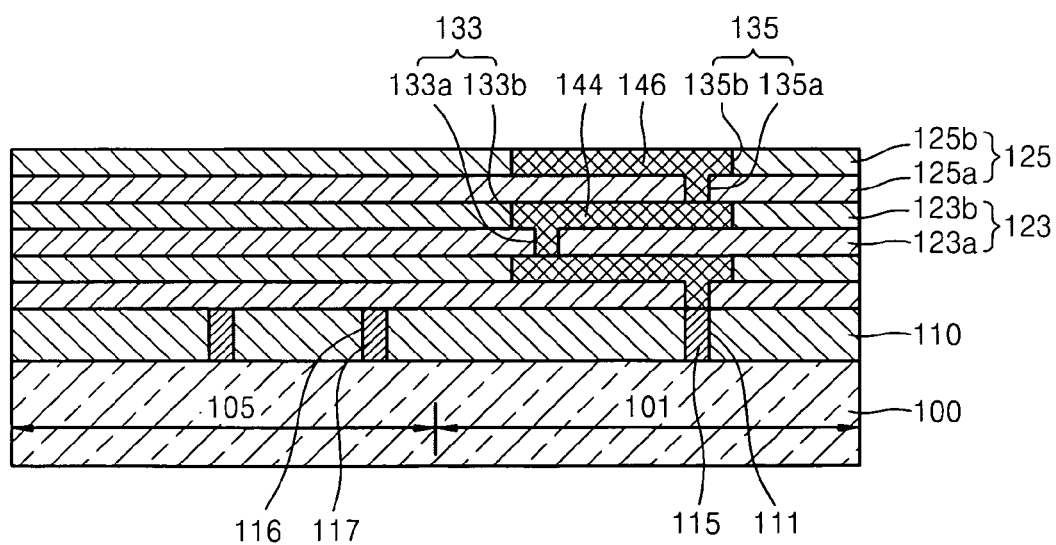
Figure 5E:
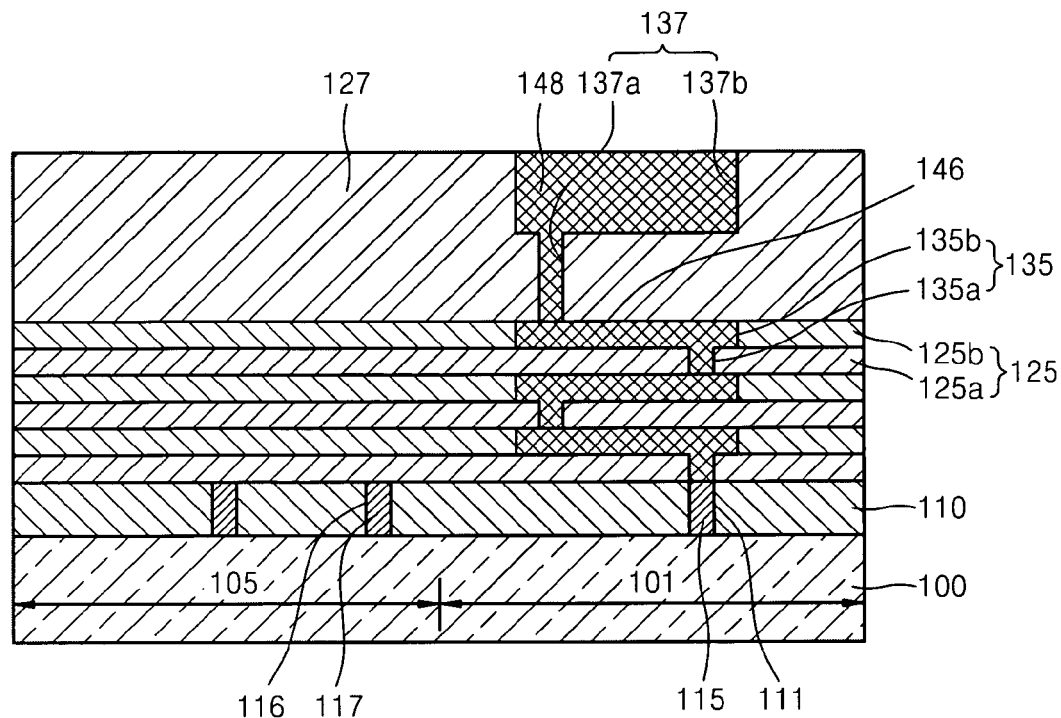

Referring to FIG. 5C, by performing a dual damascene process, a first dual damascene metal wiring 142 may be formed in a first dual damascene pattern 131 of a first interlayer insulating layer 121. Referring to FIG. 5D, a second dual damascene metal wiring 144 may be formed in a second dual damascene pattern 133 of a second interlayer insulating layer 123. Additionally, a third dual damascene metal wiring 146 may be formed in a third dual damascene pattern 135 of a third interlayer insulating layer 125. Referring to FIG. 5E, a fourth dual damascene metal wiring 148 may be formed in a fourth dual damascene pattern 137 of a fourth interlayer insulating layer 127.

Figure 5F:
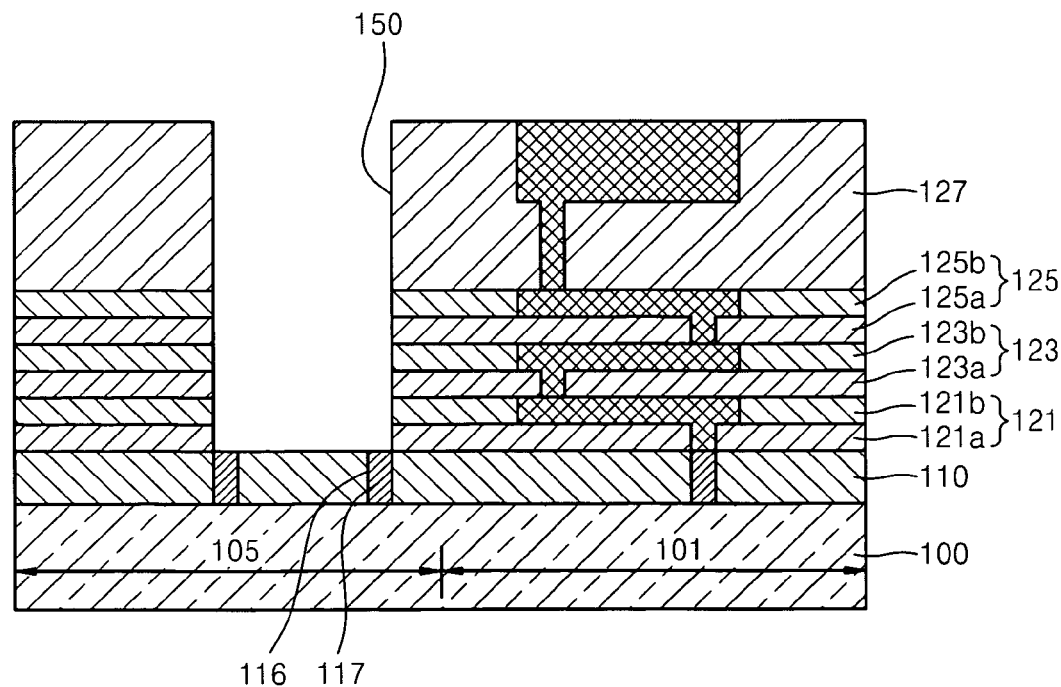
Figure 5G:
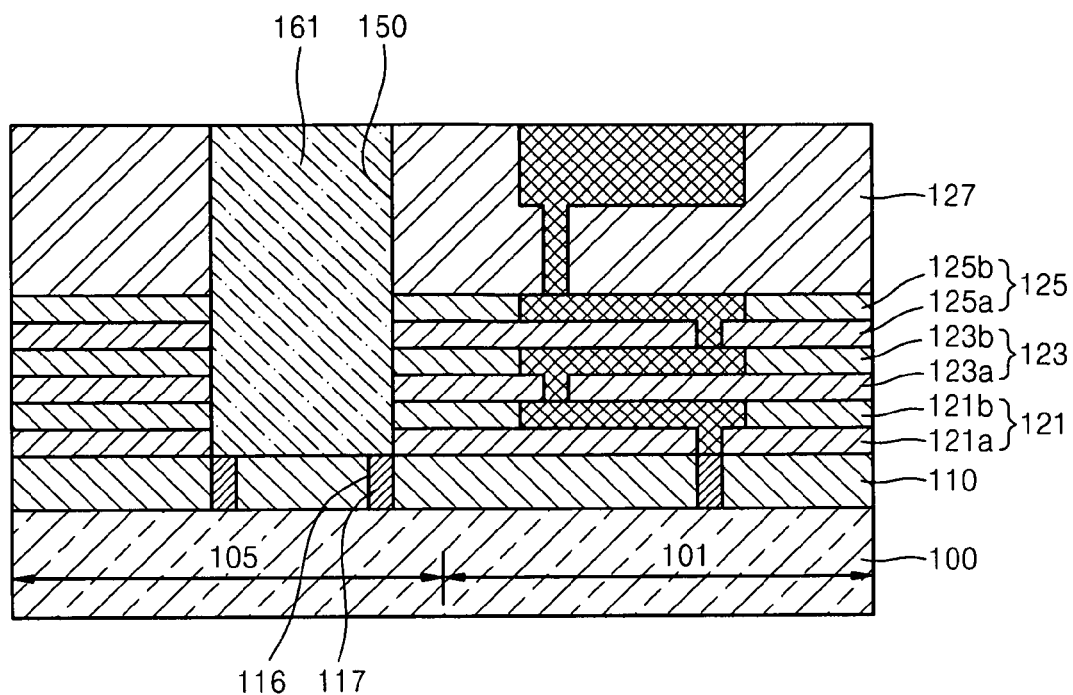

Referring to FIG. 5F, the first to fourth interlayer insulating layers 121, 123, 125, and 127 may be etched to form an opening 150 that exposes the second metal contact plug 117. A metal layer (not shown) may be deposited on the fourth interlayer insulating layer 127 to fill the opening 150. Referring to FIG. 5G, a CMP process may be performed on the metal layer to form a first crack stop structure 161 in the opening 150. The first crack stop structure 161 may contact the second metal contact plug 117. Subsequent processes for forming the semiconductor device may be as previously described above with reference to FIG. 2.

Figure 6A:
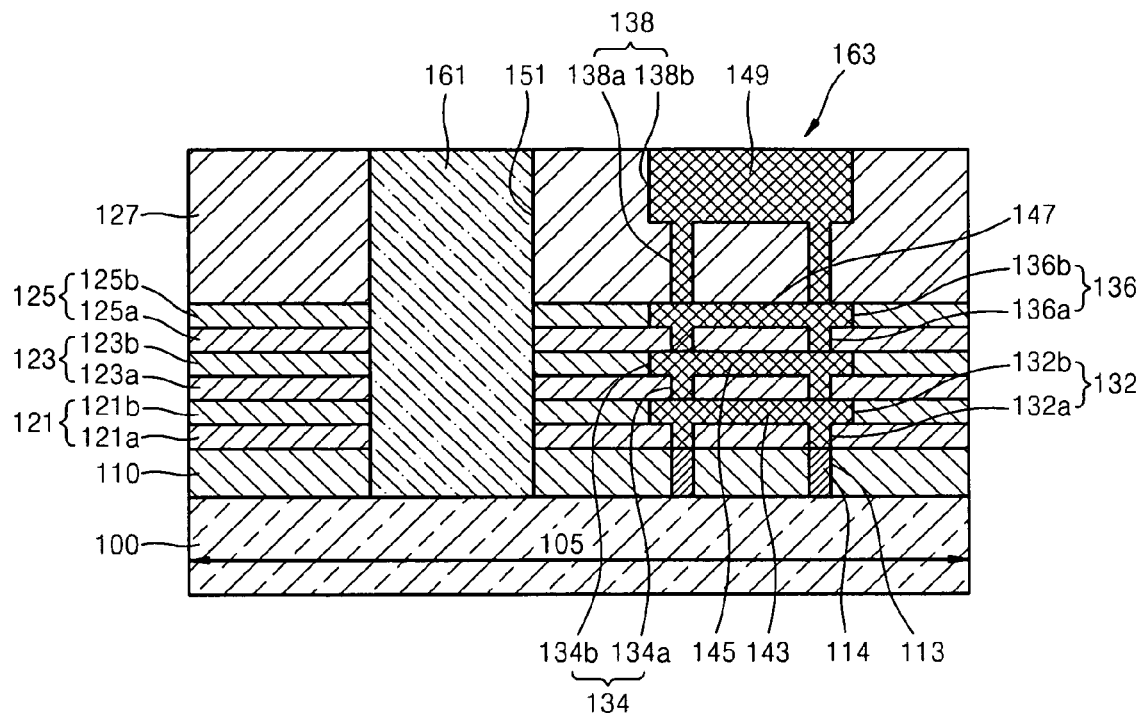
FIGS. 6A and 6B are cross-sectional views of semiconductor devices according to FIG. 1B, taken along line B-B'.
Figure 6B:
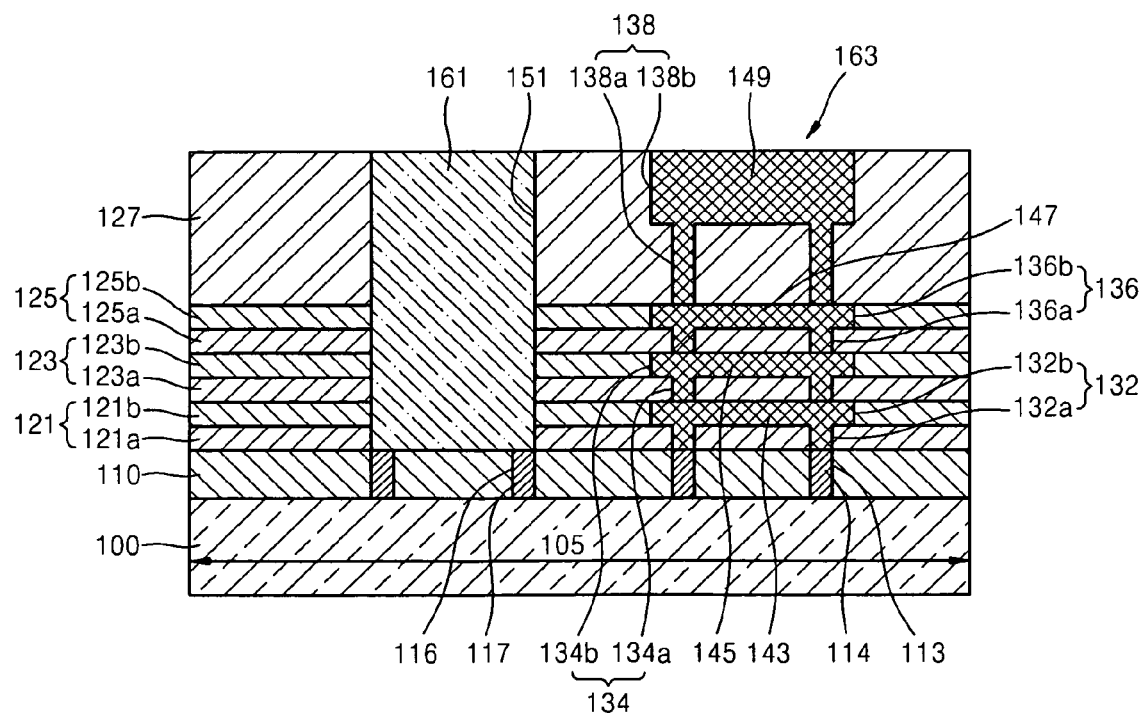

FIGS. 6A and 6B are cross-sectional views of semiconductor devices according to FIG. 1B, taken along line B-B'. The semiconductor devices of FIGS. 6A and 6B may resemble that of FIGS. 2 and 4, except for the differences described below. As noted above, the description of previously-discussed elements may have been omitted below for purposes of brevity.

Referring to FIG. 6A, an opening 151 may be formed in the crack stop region 105. A first crack stop structure 161 of a single body type may be formed in the opening 151. The first crack stop structure 161 may include copper (Cu) and/or a Ta/TaN barrier metal. The opening 151 may be formed through the insulating layer 110 and the first to fourth interlayer insulating layers 121, 123, 125, and 127 to expose a portion of the semiconductor substrate 100 in the crack stop region 105. As a result, the first crack stop structure 161 may contact the portion of the substrate 100 exposed by the opening 151.

Alternatively, referring to FIG. 6B, a second metal contact 116 may be formed in the insulating layer 110 of the crack stop region 105, and a second metal contact plug 117 may be formed in the second metal contact 116. The opening 151 may be formed through the first to fourth interlayer insulating layers 121, 123, 125, and 127 to expose the second metal contact plug 117. The first crack stop structure 161 may be formed in the opening 151 to contact the second metal contact plug 117.

Referring to FIGS. 6A and 6B, a second crack stop structure 163 may be formed adjacent to the first crack stop structure 161 on the semiconductor substrate 100 of the crack stop region 105. The second crack stop structure 163 may include fifth to eighth dual damascene metal wirings 143, 145, 147, and 149, which may be sequentially stacked on the semiconductor substrate 100. The fifth to eighth dual damascene metal wirings 143, 145, 147, and 149 may include copper (Cu) and/or a Ta/TaN barrier metal. A third metal contact 113 may be formed in the insulating layer 110, and a third metal contact plug 114 may be formed in the third metal contact 113. The second crack stop structure 163 may contact the third metal contact plug 114.

The fifth dual damascene metal wiring 143 may be formed in a fifth dual damascene pattern 132 including a fifth via 132a and a fifth trench 132b formed in the first interlayer insulating layer 121. The fifth dual damascene metal wiring 143 may contact the third metal plug 114. The sixth dual damascene metal wiring 145 may be formed in a sixth dual damascene pattern 134 including a sixth via 134a and a sixth trench 134b formed in the second interlayer insulating layer 123. The sixth dual damascene metal wiring 145 may contact the fifth dual damascene metal wiring 143. The seventh dual damascene metal wiring 147 may be formed in a seventh dual damascene pattern 136 including a seventh via 136a and a seventh trench 136b formed in the third interlayer insulating layer 125. The seventh dual damascene metal wiring 147 may contact the sixth dual damascene metal wiring 145. The eighth dual damascene metal wiring 149 may be formed in an eighth dual damascene pattern 138 including an eighth via 138a and an eighth trench 138b formed in the fourth interlayer insulating layer 127. The eighth dual damascene metal wiring 149 may contact the seventh dual damascene metal wiring 147.

Thus, the second crack stop structure 163 may be formed of the fifth to eighth dual damascene metal wirings 143, 145, 147, and 149. Alternatively, the second crack stop structure 163 may have a single body structure like the first crack stop structure 161. The second crack stop structure 163 may be arranged to surround the active region 101, and the first crack stop structure 161 may be arranged to surround the second crack stop structure 163 so as to provide a double protection structure. Therefore, the reduction or prevention of crack propagation and/or moisture penetration may be reinforced.

The second and third metal contacts 116 and 113 and the second and third metal contact plugs 117 and 114 may be simultaneously formed when the first metal contact 111 and the first metal contact plug 115 are formed in the insulating layer 110 (e.g., FIG. 3B). The second crack stop structure 163 may be simultaneously formed when the first to fourth dual damascene metal wirings 142, 144, 146, and 148 are formed in the active region 101 (e.g., FIG. 2). Thus, the fifth to eighth dual damascene patterns 132, 134, 136, and 138 may be simultaneously formed when the first to fourth dual damascene patterns 131, 133, 135, 137 are formed in the first to fourth interlayer insulating layers 121, 123, 125, and 127 (e.g., FIGS. 3D-3I). The fifth to eighth dual damascene metal wirings 143, 145, 147, and 149 may be simultaneously formed when the first to fourth dual damascene metal wirings 142, 144, 146, and 148 are formed in the first to fourth dual damascene patterns 131, 133, 135, and 137 (e.g., FIGS. 3E-3J). As described above, after forming the second crack stop structure 163, the opening 151 may be formed and the first crack stop structure 161 may be formed in the opening 151.

Figure 7A:
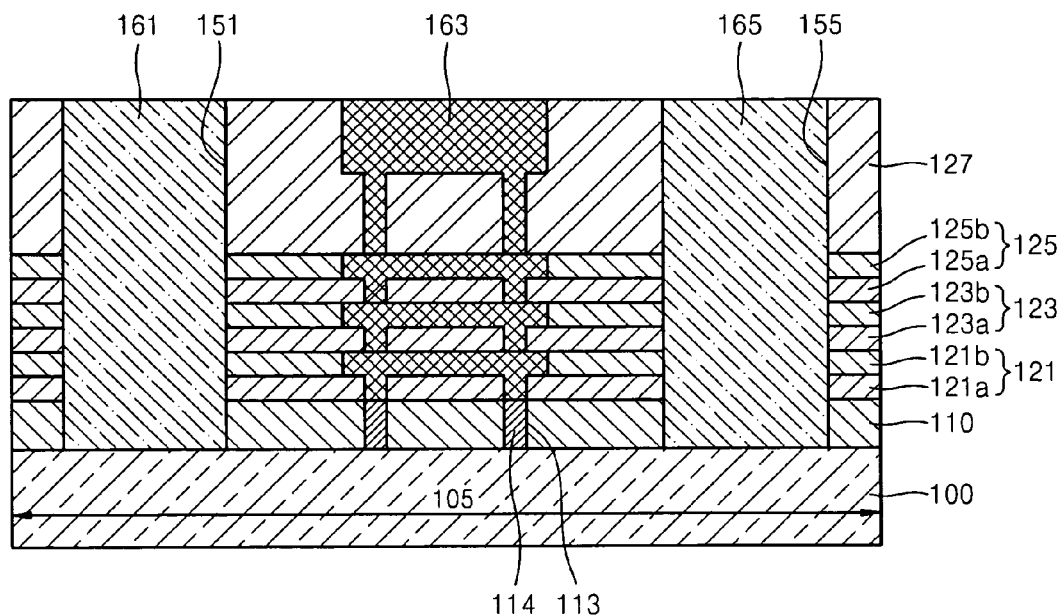
FIGS. 7A and 7B are cross-sectional views of semiconductor devices according to FIG. 1C, taken along line C-C'.
Figure 7B:
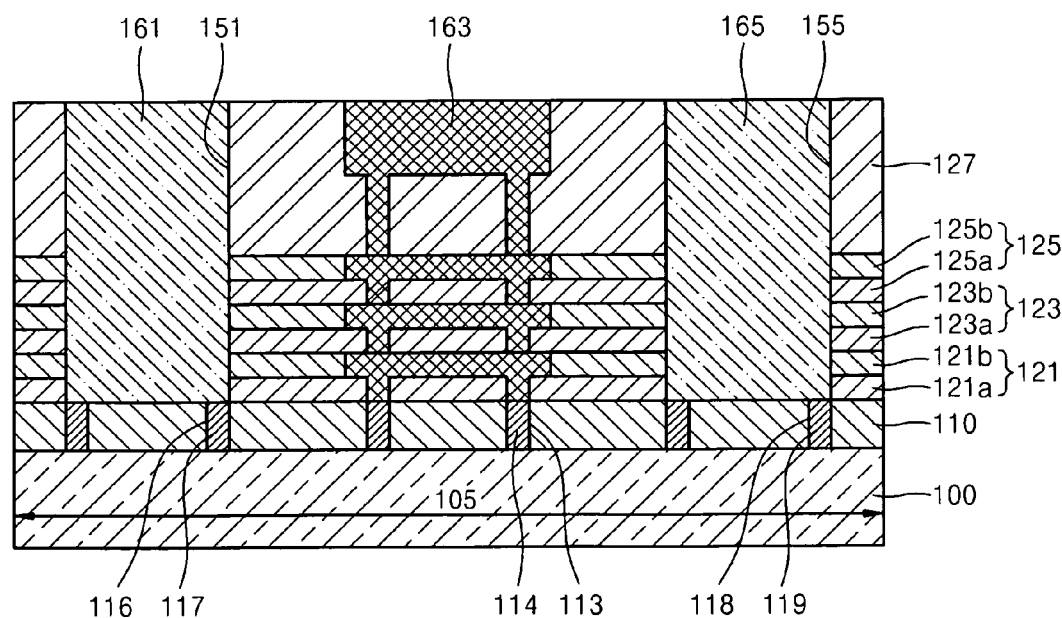

FIGS. 7A and 7B are cross-sectional views of semiconductor devices according to FIG. 1C, taken along line C-C'. The semiconductor devices of FIGS. 7A and 7B may resemble that of FIGS. 2 and 4, except for the differences described below. As noted above, the description of previously-discussed elements may have been omitted below for purposes of brevity.

Referring to FIG. 7A, first to third crack stop structures 161, 163, and 165 may be formed in the crack stop region 105. The first crack stop structure 161, the second crack stop structure 163, and the method of forming the same may be as discussed with reference to FIGS. 6A and 6B. The third crack stop structure 165 may be formed in an opening 155 adjacent to the second crack stop structure 163. Thus, the third crack stop structure 165 may have a single body type structure like the first crack stop structure 161. The opening 155 may be formed in the insulating layer 110 and the first to fourth interlayer insulating layers 121, 123, 125, and 127 to expose a portion of the semiconductor substrate 100 in the crack stop region 105. As a result, the third crack stop structure 165 may contact the exposed portion of the substrate 100.

Alternatively, referring to FIG. 7B, a fourth metal contact 118 may be formed in the insulating layer 110 in the crack stop region 105, and a fourth metal contact plug 119 may be formed in the fourth metal contact 118. The opening 155 may be formed to penetrate the first to fourth interlayer insulating layers 121, 123, 125, and 127 to expose the fourth metal contact plug 119. The second opening 155 may be simultaneously formed when forming the first opening 151. Similarly, the third crack stop structure 165 may be formed simultaneously when forming the first crack stop structure 161. The third crack stop structure 165 may contact the fourth metal contact plug 119. Although the third crack stop structure 165 is shown to have a single body type structure, example embodiments are not limited thereto. Rather, the third crack stop structure 165 may have a split structure similar to that of the second crack stop structure 163.

The third crack stop structure 165 may be arranged on the semiconductor substrate 100 to surround the active region 101. Additionally, the second crack stop structure 163 may be arranged to surround the third crack stop structure 165. Furthermore, the first crack stop structure 161 may be arranged to surround the second crack stop structure 163. Accordingly, the active region 101 may be surrounded with a triple barrier in the form of the first to third crack stop structures 161, 163, and 165, thus reducing or preventing crack propagation and/or moisture penetration.

Figure 8A:
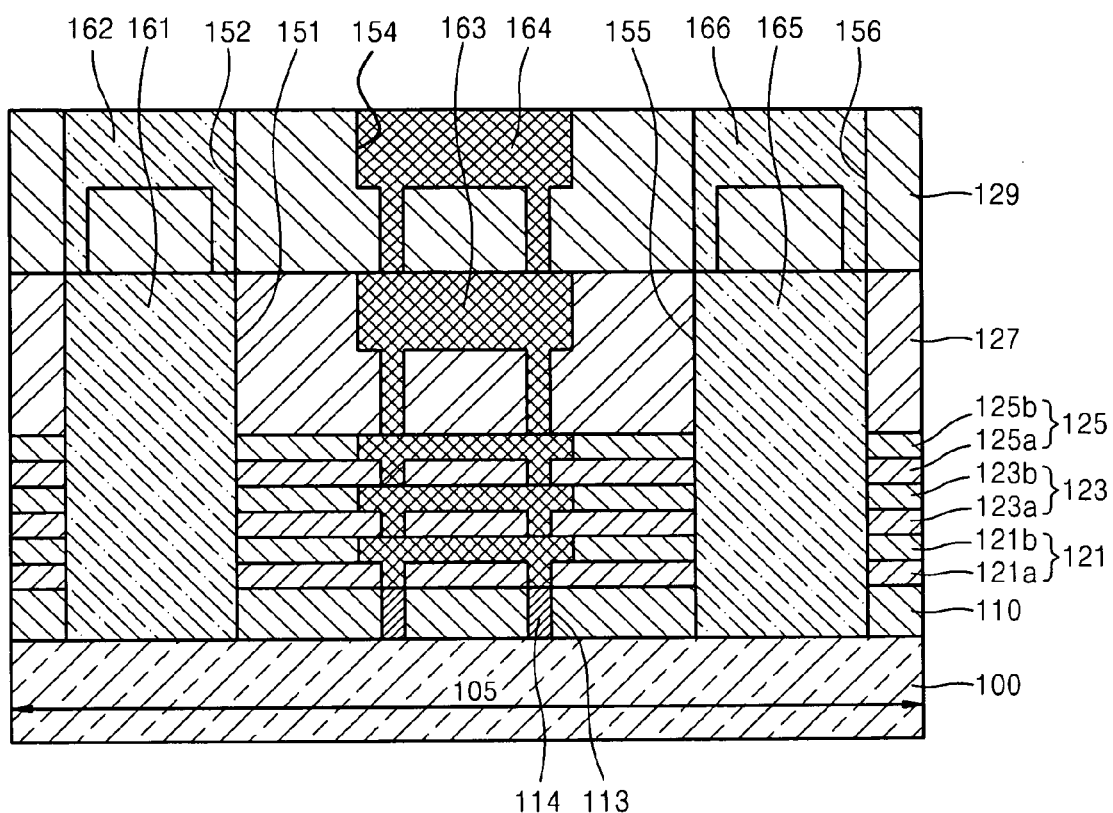
FIGS. 8A and 8B are cross-sectional views of additional semiconductor devices according to FIG. 1C, taken along line C-C'.
Figure 8B:
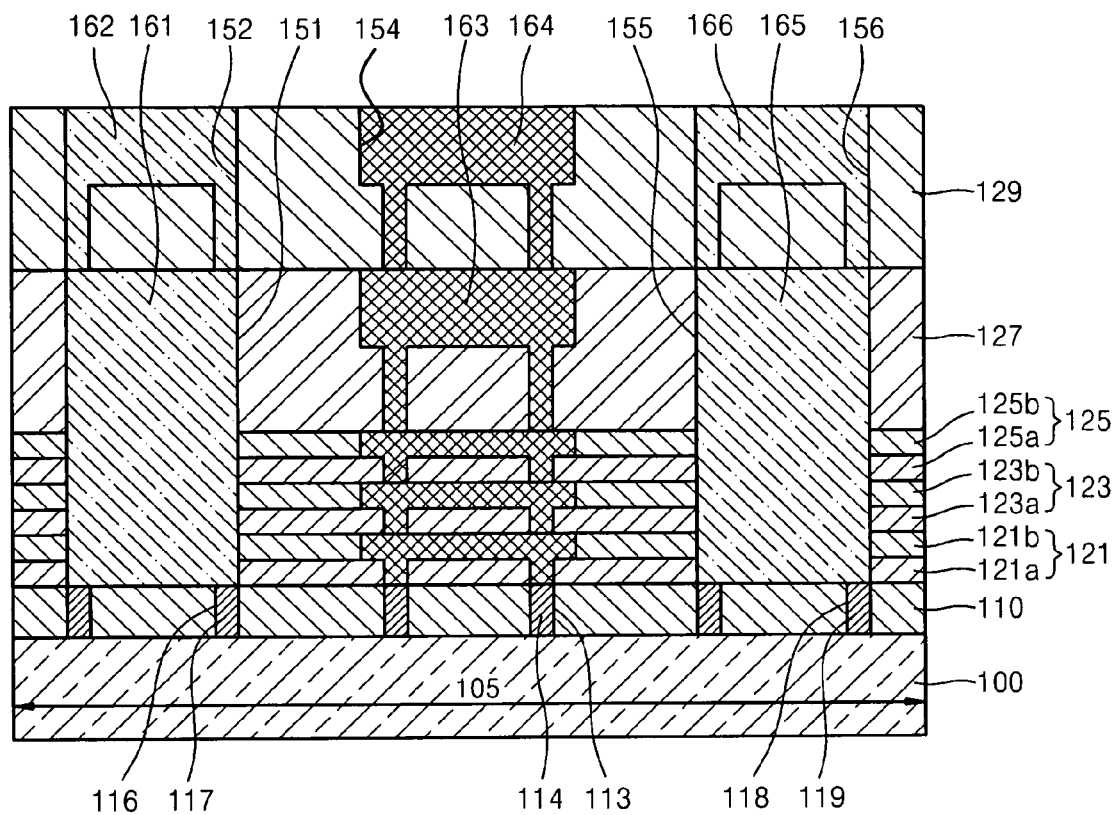

FIGS. 8A and 8B are cross-sectional views of additional semiconductor devices according to FIG. 1C, taken along line C-C'. The semiconductor devices of FIGS. 8A and 8B may resemble that of FIGS. 2 and 4, except for the differences described below. As noted above, the description of previously-discussed elements may have been omitted below for purposes of brevity.

Referring to FIGS. 8A and 8B, the first to third crack stop structures 161, 163, and 165 may be arranged in the crack stop region 105 as illustrated in FIGS. 7A and 7B, respectively. The first to third crack stop structures 161, 163, and 165 and the method of forming the same may be as described with reference to FIGS. 7A and 7B. Fourth to sixth crack stop structures 162, 164, and 166 may be formed on the first to third crack stop structures 161, 163, and 165, respectively.

A fifth interlayer insulating layer 129 may be formed on the fourth interlayer insulating layer 127. By using a dual damascene process, ninth to eleventh dual damascene patterns 152, 154, and 156 may be formed in the fifth interlayer insulating layer 129. Dual damascene metal wirings may be formed in the ninth to eleventh dual damascene patterns 152, 154, and 156 to form the fourth to sixth crack stop structures 162, 164, and 166.

The first to fourth interlayer insulating layers 121, 123, 125, and 127 may include a lower-k insulating layer (e.g., dielectric constant less than about 0.3), while the fifth interlayer insulating layer 129 may include a higher-k insulating layer (e.g., dielectric constant greater than about 3.0). If the fifth interlayer insulating layer 129 has a higher dielectric constant, then the fourth to sixth crack stop structures 162 to 166 may be separated from the first to third crack stop structures 161 to 165, although example embodiments are not limited thereto. Furthermore, only one or two of the fourth to sixth crack stop structures 162, 164, and 166 may be formed.

The third and sixth crack stop structures 165 and 166 may be arranged on the semiconductor substrate 100 to surround the active region 101. Additionally, the second and fifth crack stop structures 163 and 164 may be arranged to surround the third and sixth crack stop structures 165 and 166. Furthermore, the first and fourth crack stop structures 161 and 162 may be arranged to surround the second and fifth crack stop structures 163 and 164. Accordingly, the active region 101 may be surrounded by the first to sixth crack stop structures 161 to 166, thus reducing or preventing crack propagation and/or moisture penetration.

The semiconductor device according to example embodiments may include a single body crack stop structure arranged to surround an active region of a semiconductor chip region. The crack stop structure according to example embodiments may reduce or prevent the propagation of cracks in an interlayer insulating layer during a wafer cutting process. The crack stop structure according to example embodiments may also reduce or prevent the penetration of moisture through a cutting plane of the wafer. Accordingly, potential damage to a semiconductor chip may be reduced or prevented.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A semiconductor device comprising:
    a semiconductor substrate having a crack stop region surrounding an active region;
    a plurality of interlayer insulating layers on the semiconductor substrate;
    first dual damascene patterns in the plurality of interlayer insulating layers, the first dual damascene patterns aligned perpendicularly to and exposing a first portion of the semiconductor substrate in the active region;
    a first opening extending through the plurality of interlayer insulating layers and exposing a second portion of the semiconductor substrate in the crack stop region;
    first dual damascene metal wirings disposed in the first dual damascene patterns, at least one of the first dual damascene metal wirings contacting the exposed first portion of the semiconductor substrate; and
    a single body first crack stop structure disposed in the first opening, the first crack stop structure contacting the exposed second portion of the semiconductor substrate, wherein each of the plurality of interlayer insulating layers includes a lower interlayer insulating layer and an upper interlayer insulating layer, and each of the first dual damascene patterns includes a first via in the corresponding lower interlayer insulating layer and a first trench in the corresponding tipper interlayer insulating layer.

2. The semiconductor device of claim 1, wherein the plurality of interlayer insulating layers include a lower-k insulating layer.

3. The semiconductor device of claim 1, wherein the first crack stop structure is formed of the same material as the first dual damascene metal wirings.

4. The semiconductor device of claim 3, wherein the first crack stop structure and the first dual damascene metal wirings include copper.

5. The semiconductor device of claim 1, further comprising:
    a first insulating layer between the plurality of interlayer insulating layers and the semiconductor substrate, the first insulating layer having a first metal contact on the exposed first portion of the semiconductor substrate; and
    a first metal contact plug disposed in the first metal contact, the first metal contact plug contacting at least one of the first dual damascene metal wirings.

6. The semiconductor device of claim 5, wherein the first opening extends through the first insulating layer and the plurality of interlayer insulating layers to allow the first crack stop structure to directly contact the exposed second portion of the semiconductor substrate.

7. The semiconductor device of claim 5, wherein the first insulating layer further comprises:
    a second metal contact on the exposed second portion of the semiconductor substrate; and
    a second metal contact plug disposed in the second metal contact, the first crack stop structure contacting the exposed second portion of the semiconductor substrate through the second metal contact plug.

8. The semiconductor device of claim 5, further comprising:
    a second insulating layer on the plurality of interlayer insulating layers, the second insulating layer having a second dual damascene pattern exposing a top surface of the first crack stop structure in the crack stop region; and
    a second crack stop structure disposed in the second dual damascene pattern, the second crack stop structure directly contacting the top surface of the first crack stop structure.

9. The semiconductor device of claim 8, wherein the second insulating layer includes a higher-k interlayer insulating layer.

10. The semiconductor device of claim 9, wherein the first and second crack stop structures are formed of the same material as the first dual damascene metal wirings.

11. The semiconductor device of claim 5, further comprising:
    a single body second crack stop structure spaced apart from the first crack stop structure and disposed in the crack stop region, the second crack stop structure surrounding the active region.

12. The semiconductor device of claim 11, wherein the plurality of interlayer insulating layers further comprise:
    a second opening in the crack stop region, the second opening spaced apart from the first opening and exposing a third portion of the semiconductor substrate, wherein the second crack stop structure is disposed in the second opening.

13. The semiconductor device of claim 12, wherein the first and second openings extend through the first insulating layer and the plurality of interlayer insulating layers to allow the first and second crack stop structures to directly contact the exposed second and third portions of the semiconductor substrate.

14. The semiconductor device of claim 12, wherein the first insulating layer further comprises:
   a second metal contact on the exposed second portion of the semiconductor substrate and filled with a second metal contact plug; and
   a third metal contact on the exposed third portion of the semiconductor substrate and filled with a third metal contact plug,
   wherein the first and second crack stop structures contact the exposed second and third portions of the semiconductor substrate through the second and third metal contact plugs, respectively.

15. The semiconductor device of claim 14, further comprising
   a third crack stop structure disposed in the crack stop region and surrounding the active region.

16. The semiconductor device of claim 15, wherein the plurality of interlayer insulating layers further comprise:
   second dual damascene patterns disposed in the crack stop region and aligned perpendicularly to the surface of the semiconductor substrate, the third crack stop structure including second dual damascene metal wirings disposed in the second dual damascene patterns.

17. The semiconductor device of claim 16, wherein each of the second dual damascene patterns includes a second via in the corresponding lower interlayer insulating layer and a second trench in the corresponding upper interlayer insulating layer.

18. The semiconductor device of claim 16, further comprising:
   a second insulating layer on the plurality of interlayer insulating layers, the second insulating layer including third to fifth dual damascene patterns exposing top surfaces of the first to third crack stop structures in the crack stop region; and
   fourth to sixth crack stop structures disposed in the third to fifth dual damascene patterns, the fourth to sixth crack stop structures directly contacting the top surfaces of the first to third crack stop structures.

19. The semiconductor device of claim 15, wherein the first insulating layer further comprises:
   a fourth metal contact exposing a fourth portion of the semiconductor substrate, the fourth metal contact filled with a fourth metal contact plug, wherein the third crack stop structure contacts the exposed fourth portion of the semiconductor substrate through the fourth metal contact plug.

20. A semiconductor device comprising:
   a plurality of interlayer insulating layers on a semiconductor substrate, each of the plurality of interlayer insulating layers having a dual damascene pattern above an active region of the semiconductor substrate;
   a dual damascene metal wiring in each dual damascene pattern;
   an opening extending through the plurality of interlayer insulating layers and exposing a crack stop region of the semiconductor substrate; and
   a single body crack stop structure in the opening and contacting the exposed crack stop region,
   wherein each of the plurality of interlayer insulating layers includes a lower interlayer insulating layer and an upper interlayer insulating layer, and each dual damascene pattern includes a via in the corresponding lower interlayer insulating layer and a trench in the corresponding upper interlayer insulating layer.

* * * * *